United States Patent
Mewes et al.

(10) Patent No.: US 10,255,390 B2
(45) Date of Patent: Apr. 9, 2019

(54) PREDICTION OF IN-FIELD DRY-DOWN OF A MATURE SMALL GRAIN, COARSE GRAIN, OR OILSEED CROP USING FIELD-LEVEL ANALYSIS AND FORECASTING OF WEATHER CONDITIONS AND CROP CHARACTERISTICS INCLUDING SAMPLED MOISTURE CONTENT

(71) Applicant: ITERIS, INC., Santa Ana, CA (US)

(72) Inventors: John J. Mewes, Mayville, ND (US); Dustin M. Salentiny, Grand Forks, ND (US)

(73) Assignee: CLEARAG, INC., Santa Ana, CA (US)

( * ) Notice: Subject to any disclaimer, the term of this patent is extended or adjusted under 35 U.S.C. 154(b) by 0 days.

(21) Appl. No.: 15/345,843

(22) Filed: Nov. 8, 2016

(65) Prior Publication Data

US 2017/0061299 A1    Mar. 2, 2017

Related U.S. Application Data

(63) Continuation of application No. 14/842,853, filed on Sep. 2, 2015, now Pat. No. 9,518,753.

(51) Int. Cl.
*G06N 20/00* (2019.01)
*G06F 17/50* (2006.01)
(Continued)

(52) U.S. Cl.
CPC ........ *G06F 17/5009* (2013.01); *A01B 79/005* (2013.01); *A01D 91/00* (2013.01);
(Continued)

(58) Field of Classification Search
CPC .......... G06N 5/04; G06N 20/00; G01W 1/10; G06F 17/50; A01D 91/00; A01G 1/00; A01G 25/16
See application file for complete search history.

(56) References Cited

U.S. PATENT DOCUMENTS

| | | | | |
|---|---|---|---|---|
| 2010/0306012 | A1* | 12/2010 | Zyskowski | ........ G06Q 10/0637 705/7.36 |
| 2012/0109614 | A1* | 5/2012 | Lindores | .............. A01B 79/005 703/11 |

OTHER PUBLICATIONS

Nielsen, R. L. "Field drydown of mature corn grain." Purdue University, West Lafayette, IN (2011).*
(Continued)

*Primary Examiner* — Eric Nilsson
(74) *Attorney, Agent, or Firm* — Lazaris IP

(57) ABSTRACT

A modeling framework for evaluating the impact of weather conditions on farming and harvest operations applies real-time, field-level weather data and forecasts of meteorological and climatological conditions together with user-provided and/or observed feedback of a present state of a harvest-related condition to agronomic models and to generate a plurality of harvest advisory outputs for precision agriculture. A harvest advisory model simulates and predicts the impacts of this weather information and user-provided and/or observed feedback in one or more physical, empirical, or artificial intelligence models of precision agriculture to analyze crops, plants, soils, and resulting agricultural commodities, and provides harvest advisory outputs to a diagnostic support tool for users to enhance farming and harvest decision-making, whether by providing pre-, post-, or in situ-harvest operations and crop analyzes.

25 Claims, 2 Drawing Sheets

(51) Int. Cl.
| | |
|---|---|
| *A01B 79/00* | (2006.01) |
| *A01D 91/00* | (2006.01) |
| *A01G 25/16* | (2006.01) |
| *G06N 99/00* | (2019.01) |
| *G05B 13/04* | (2006.01) |
| *G06Q 50/02* | (2012.01) |
| *A01F 12/58* | (2006.01) |
| *G01W 1/10* | (2006.01) |
| *G06N 5/04* | (2006.01) |
| *A01G 22/00* | (2018.01) |
| *A01F 25/22* | (2006.01) |

(52) U.S. Cl.
CPC .............. *A01F 12/58* (2013.01); *A01G 22/00* (2018.02); *A01G 25/167* (2013.01); *G01W 1/10* (2013.01); *G05B 13/048* (2013.01); *G06N 5/04* (2013.01); *G06N 20/00* (2019.01); *G06N 99/00* (2013.01); *G06Q 50/02* (2013.01); *A01F 25/22* (2013.01); *Y02A 40/12* (2018.01); *Y02A 90/14* (2018.01)

(56) References Cited

OTHER PUBLICATIONS

Takle, E., et al. "Climate forecasts for corn producer decision making." Earth Interactions 18.5 (2014): pp. 1-8.*

* cited by examiner

PREDICTION OF IN-FIELD DRY-DOWN OF A MATURE SMALL GRAIN, COARSE GRAIN, OR OILSEED CROP USING FIELD-LEVEL ANALYSIS AND FORECASTING OF WEATHER CONDITIONS AND CROP CHARACTERISTICS INCLUDING SAMPLED MOISTURE CONTENT

CROSS-REFERENCE TO RELATED PATENT APPLICATIONS

This patent application claims priority to, and is a continuation of, U.S. non-provisional application Ser. No. 14/842,853, filed on Sep. 2, 2015, the contents of which are incorporated in their entirety herein. In accordance with 37 C.F.R. § 1.76, a claim of priority is included in an Application Data Sheet filed concurrently herewith.

FIELD OF THE INVENTION

The present invention relates to harvest operations in precision agriculture. Specifically, the present invention relates to a system and method of applying real-time, field-level weather simulation and prediction to one or more agricultural models to generate a series of harvest advisory outputs in a tool for supporting farm operations management.

BACKGROUND OF THE INVENTION

Harvest operations for a variety of agricultural commodities are substantially influenced by environmental factors, such as the weather. While some weather conditions, such as precipitation, may create an obvious deterrent to harvest operations, more benign daily weather characteristics also play subtle yet significant roles. For example, many commodities require that the harvested product be at or below a product-dependent moisture threshold before they can be stably stored at ambient temperatures (at least without taking specific steps to keep the product stable, such as the maintenance of a constant airflow through the product). On the other extreme, delaying harvest for too long can result in the crop becoming overly dry, potentially exposing seeds to damage during the threshing process, or removing permissible water weight from the product. Such an occurrence of delayed harvest may result in lower crop revenue, since payments are often based on mass. Similarly, crop temperature thresholds may be a major consideration for long-term storage of some crops, for example tuberous crops such as potatoes and sugar beets, where cold conditions are advantageous.

The harvest operation itself is also often sensitive to plant, product, and soil moisture and temperature levels. For instance, green plants, or even deceased plants with a heightened moisture level, often create difficulty for harvest operations that are based on the use of a threshing action to separate the seed (or other product) from the parent plant. This can result in both yield loss due to un-threshed seeds passing through and out of the harvester, and seed damage due to the repeated or harsh threshing action that may be required. Frozen or excessively wet soils can also inhibit harvest operations for various crops, depending upon the harvest mechanism for the particular crop. Each of the product, plant, and soil moisture and temperature therefore impact both the timing and viability of harvest operations, and all of these qualities are highly influenced by complex interactions between plant and soil characteristics and environmental conditions.

As global agricultural operations continue to grow in size, the practicality of in-situ monitoring of field conditions on a regular basis is becoming increasingly diminished. Further, the often substantial equipment and labor resources involved in harvest operations are not easily moved across significant distances in an effort to find fields with viable or more favorable harvest conditions. The ability to both diagnose and predict the viability of harvest operations in a potentially remote field is therefore of increasing importance to the management of modern farm operations. Also, production agriculture is often a capital-intensive business with very thin relative profit margins. The ability to more effectively manage the logistics associated with deployment of a farm operation's equipment and human resources is therefore becoming increasingly critical to profitability and long-term viability of the farm itself.

In part because agricultural research globally is largely carried out by institutions with local or regional focus, agronomic models are often based on sample datasets that are limited in size and/or geographic representativeness, with less than ideal documentation of (or accommodation for) associated weather and environmental conditions. Because of this, there are very few models that can be picked up and applied to other locations and timeframes without a potentially substantial loss in model accuracy. Models for the same processes can often lead to diametrically opposed conclusions when applied at differing locations because of model shortcomings that are due to a lack of understanding of the extent to which localized influences impact the associated processes during the development of the model.

Existing solutions do not provide a sufficient framework for utilizing weather analysis and prediction to accurately diagnose field-level weather conditions for precision agriculture to overcome the challenges above. Accordingly, there is a strong need not found in the existing art for a system and method that provides an improved process for application of weather information in agronomic modeling to produce a better understanding of farm and harvest operations. There is also a need not found in the existing art for support tools designed to provide real-time assessments of weather conditions and the impact on crops, plants, soils, and resulting agricultural products to enable improvements in farm and harvest operations.

BRIEF SUMMARY OF THE INVENTION

It is therefore one objective of the present invention to provide a system and method of applying real-time assessments of weather conditions to precision agriculture models for enhancing harvest operations. It is another objective to combine real-time and location-tagged data communication in farm operations with such real-time assessments of weather conditions for generating harvest advisory information in precision agriculture. It is still another objective of the present invention to combine user-provided and/or observed feedback of a present state of a harvest-related condition with real-time assessments of weather conditions for generating harvest advisory information in precision agriculture. It is yet another objective of the present invention to provide a diagnostic support tool for enhanced decision-making in harvest operations.

There are many other specific objectives of the present invention. One such objective is to provide a system and method of predicting dry-down of a crop over time, such as a mature small grain, coarse grain, or oilseed crop, for planning the timing of harvest operations. It is another such objective of the present invention to provide a system and method of predicting the time-varying unit costs, per percent moisture per unit of mass or volume, associated with fuel-based or forced-air mechanical drying of crops resulting from changing weather conditions and the characteristics of the drying facility. Yet another objective of the present invention is to provide a system and method of predicting the time-varying unit costs, per unit of mass or volume, associated with the combined impacts of time-varying grain moisture levels of a crop to be harvested and the time-varying unit costs per percent moisture per unit of mass or volume of forced-air or fuel-based mechanical drying.

It is another objective to provide tools for assessing a risk of delayed harvest operations to achieve favorable crop moisture levels, for evaluating soil temperature and soil moisture in a given field to provide guidance as to when soil conditions are likely to inhibit harvest and post-harvest tillage operations due to soil being exceedingly wet or frozen, and for evaluating the impact of time-varying soil temperature in a given field for the timing of harvest operations as it pertains to the internal temperature of root-based crops and their long-term storage stability at those temperatures.

Other objectives of the present invention include providing systems and methods for predicting the day-by-day and intraday windows of opportunity for harvest operations owing to time-varying threshability as a result of interactions between a standing crop and atmospheric and soil conditions, to aid in more immediate planning of harvest operations; predicting the dry-down of hay (alfalfa, etc.) and other cuttings over time for planning the timing or windows of opportunity of cutting, windrowing, silageing, or bailing operations; and assisting in decision-making for application of a desiccant to affect a desired harvest window.

The present invention is a system and method of evaluating, diagnosing, and predicting various agronomic conditions attendant to farming activities in an advisory model configured to simulate and predict the impact of weather conditions on harvest operations. The present invention applies real-time, field-level data representative of assessments of localized weather conditions, together with real-time and location-tagged communication of data of various types and content, and long-range climatological and/or meteorological forecasting, to one or more physical, empirical, or artificial intelligence models of precision agriculture to analyze crops, plants, soils, and resulting agricultural commodities, and generate a plurality of harvest advisory outputs. Such outputs are provided either directly to farmers, to third parties, or in a harvest advisory tool based on the advisory model for supporting precision agricultural operations.

Through application of the harvest advisory modeling paradigms discussed herein, the prospects for providing improved guidance relating to farm and harvest operations has the potential to be very substantial in the field of precision agriculture. For example, diagnosing and predicting the in-field dry-down of agricultural commodities, the efficiency of fuel-based and/or forced-air grain drying activities, the associations between plant moisture and atmospheric conditions, and the soil temperature and moisture profiles all provide significant value-added benefit. Recent parallel advances in weather analysis and prediction, and in the availability of mechanisms for facilitating real-time and location-tagged data communication in farm operations, have created an enticing set of possible new applications for addressing the problems described above, and others. The application of both in-situ (though not necessarily in or near a given field) and remotely-sensed weather information, in combination with scientific and computational advances in the integration of data collected by these disparate weather observing systems, permit the diagnosis of field-level weather conditions with accuracy that greatly improve upon that obtained with the deployment of a basic weather station to each and every field.

Further, advances in the understanding of the interactions between the land surface and the overlying atmosphere, combined with other improvements to the physics of meteorological weather models, and the ever-increasing computational power available to operate these models, enable a level of both short-term and long-term accuracy and locality to weather forecasts that has not been previously attainable.

The present invention also applies time- and location-tagged feedback and observations on current and recent characteristics representing measurements of various crop states, such as moisture and temperature, to the one or more physical, empirical, or artificial intelligence models of precision agriculture. Such feedback and observations provide an enhanced collection of data along with the associated weather conditions and other relevant information to build more comprehensive datasets that are used to make far-reaching improvements to associated physical models for diagnosing and predicting underlying harvest-related conditions. Artificial intelligence is also incorporated to this more comprehensive dataset to draw automatic associations between available external data and the harvest-related condition to yield further models for simulating harvest conditions. Artificial intelligence in the present invention is also retrained as more and more data are accumulated, and the results may be tested against independent data in an effort to find the most reliable model. Such a model framework implicitly yields information as to the importance of related factors through the resulting weighting systems between inputs, subcomponents within the artificial intelligence layer, and the model output(s). Together, this feedback and observations, and physical, empirical, and artificial intelligence modeling paradigms discussed herein significantly enhance the analysis of crops, plants, soils, and resulting agricultural commodities within the present invention to generate harvest advisory outputs and improved guidance for farm and harvest operations.

Other objects, embodiments, features and advantages of the present invention will become apparent from the following description of the embodiments, taken together with the accompanying drawings, which illustrate, by way of example, the principles of the invention.

BRIEF DESCRIPTION OF THE SEVERAL VIEWS OF THE DRAWINGS

The accompanying drawings, which are incorporated in and constitute a part of this specification, illustrate several embodiments of the invention and together with the description, serve to explain the principles of the invention.

DETAILED DESCRIPTION OF THE INVENTION

In the following description of the present invention reference is made to the exemplary embodiments illustrating the principles of the present invention and how it is practiced. Other embodiments will be utilized to practice the present invention and structural and functional changes will be made thereto without departing from the scope of the present invention.

Figure 1:
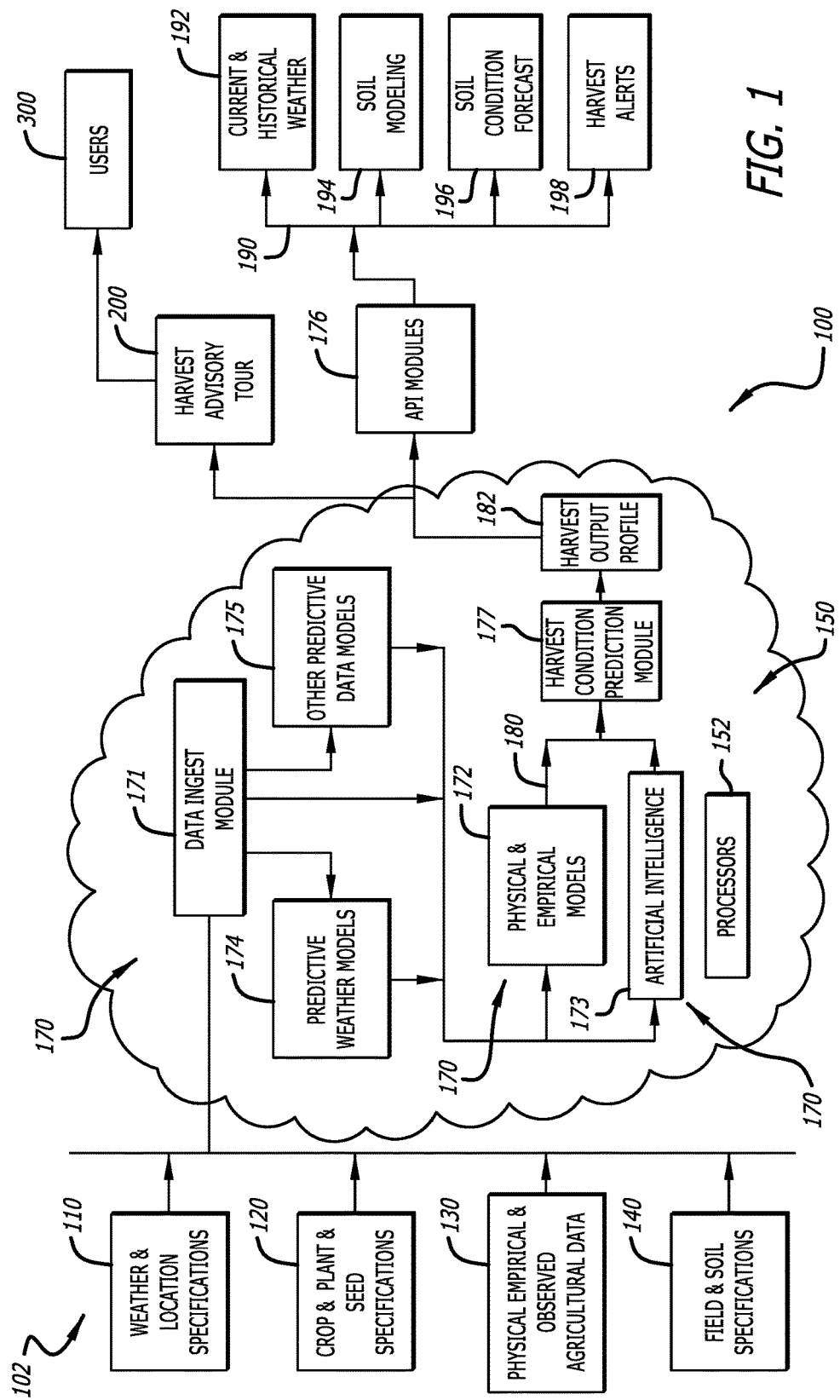
FIG. 1 is a systemic diagram of a harvest advisory model and support tool for according to the present invention.

FIG. 1 is a system diagram of a harvest advisory model 100 for evaluating, diagnosing, and predicting various agronomic conditions that have an impact on farm and harvest operations, according to one embodiment of the present invention. The harvest advisory model 100 is performed within one or more systems and/or methods that includes several components, each of which define distinct activities required to apply real-time, field-level data representative of assessments of localized weather conditions, together with real-time and location-tagged communication of data of various types and content, and long-range climatological and/or meteorological forecasting to analyze crops, plants, soils, and agricultural products, to generate a plurality of harvest condition advisory outputs, and enable a harvest advisory tool 200 configured to provide diagnostic support to farm and harvest operations.

The harvest advisory model 100 ingests, or receives, input data 102 that includes weather and location specifications 110, such as meteorological data 111, real-time, field-level weather data 112, observed weather data 113 that has occurred, for example, during a current growing season, and extended-range weather and climatological forecast information 114. The weather and location specifications 110 may also include other types of real-time and location-tagged data 115, such as for example GPS data 116, and data captured from orbiting satellites or remotely powered vehicles that when processed provide details at a field-level resolution, such as remotely-sensed satellite imagery data 117 and remotely-captured drone imagery data 118. The input data 102 may further include crop and plant specifications 120 such as for example the type, variety and relative maturity of the crop 121, and other planting, chemical application, and harvest data 122, such as for example the date that a field was planted with seed, the population of planted seeds per specified area, when a field was sprayed for example with a pesticide, desiccant, other chemical, the type and amount of chemical applied, and anticipated temporal harvest data such as an expected harvest date or harvest window. The crop and plant specifications 120 may also include the desired crop temperature 123, crop moisture 124, seed moisture 125, facility storage dimensions and specifications 126, and airflow characteristics for a stored crop 127. Additional information may include planting information such as plant depth 128 and row width 129.

The input data 102 may also include field and soil specifications 140, which may further include data such as for example the soil type 141 in which a crop was planted, and attributes such as soil temperature 142, soil moisture 143, current and/or forecasted soil conditions 144, overall soil profile 145, levels of vegetative debris 146 existing at the time of planting, and nutrient levels 147 present.

The input data 102 may also include physical, empirical, or observed agricultural data 130, such as for example sampled crop moisture content 131. This may include data such as samples and/or observations of actual grain moisture taken from a planted field at one or more times, and the associated dry-down of the grain in a particular field over time. Other examples of such data 130 include data regarding temporal harvestability windows 132 for a particular crop at a particular location over some recent period of time, or for various crops at various locations, over time. This may include, for example, temporal windows of threshability of a seed-based crop over some recent period of time, temporal windows of cut-windrow-bail operations for crops such as hay at a particular location over some recent period of time, and temporal windows of mature growth stages, desiccant efficacy, and harvestability for a particular desiccant for particular crop at a particular location over some recent period of time.

The physical, empirical, or observed agricultural data 130 may further include descriptive metadata reflecting actual performance, realization, or implementation of one or more of crops, plants, fields, soils, and facilities. This metadata may include crop and seed metadata 133 such as the relative maturity and dry-down characteristics of the variety, pest and disease susceptibility or resistance, whether a crop is irrigated or non-irrigated, and type and origin of seeds (for example, genetically modified or non-genetically modified, and company source). Such metadata may also include soils metadata 134 such as information relating to previous crop grown on or in the soil, tillage practice, soil composition, presence of surface and/or subsurface drainage, nutrient composition, rate of degradation, rate of water movement in both a lateral and vertical direction, presence of materials such as salts in soil strata, and facility metadata 135 such as metadata relating to type characteristics, for example whether the facility is a forced-air drying facility or a fuel-based mechanical grain drying facility, and their associated resources and costs.

All of this input data is ingested into the harvest advisory model 100 via a data ingest module 171 as shown in the system diagram of FIG. 1. The harvest advisory model 100 ingests this input data 102 and applies it to one or more precision agriculture (agronomic) models 160 which may include artificial intelligence-derived precision agriculture models, to produce output data 180. The output data 180 of the harvest advisory model 100 is represented a harvest condition output profile 181 that is provided to a harvest advisory tool 200 that can be used to predict, simulate, and forecast harvest conditions 270 as discussed further herein.

The input data 102 is applied to the one or more precision agriculture models 160 in a plurality of data processing modules 170 within a computing environment 150 that also includes one or more processors 152 and a plurality of software and hardware components. The one or more processors 152 and plurality of software and hardware components are configured to execute program instructions to perform the functions of the harvest advisory model 100 described herein, and embodied in the one or more data processing modules 170.

The plurality of data processing modules 170 include, in addition to the data ingest module 171, a physical and empirical models module 172, and an artificial intelligence module 173 configured to apply a layer of artificial intelligence to the harvest advisory model 100 to develop relationships between input data 102 and outputs from other precision agriculture models to perform and improve the assessments, diagnoses, simulations, forecasts, and predictions that form the harvest condition output profile 182. The plurality of data processing modules 170 also includes a harvest condition prediction module 177 configured to generate the harvest condition outputs 270.

The physical and empirical models module 172 enables application of the input data 102 to the one or more precision agriculture models 160. Such models 160 include crop, soil, plant, and other modeling paradigms, such as for example phenological models that include general crop-specific and crop variety-specific models, a common example being growing degree day (GDD) models. These models 160 also include soil models such as the EPIC, APEX, and ICBM soil models, and land surface models such as the NOAH, Mosaic, and VIC models. Other models contemplated within the scope of the present invention include crop-specific, site-specific, and attribute-specific physical models, such as models for simulating temperature, moisture, wetness, in-field crop dry-down, plant-atmosphere vapor diffusion, plant rewetting associated with precipitation, and deterministic and stochastic grain drying models that parameterize the unique drying characteristics of a specific crop to be dried based on characteristics of the drying process and statistical models, and models for analyzing storage characteristics of crops, seeds, soils, and storage facilities. It is contemplated that the input data 102 may be applied to existing precision agriculture models, as well as customized models for specific harvest conditions 270, for example simulation of expected dry-down of grain in the particular field, grain and plant moisture levels, and temperature and moisture content of a root-based crop over time, and other simulations, predictions, and forecasts as noted herein.

The harvest condition output profile 182, as noted above, is output data 180 of the harvest advisory model 100. Once the harvest advisory model 100 has generated the harvest condition output profile 182, the present invention applies the harvest condition output profile 182 to develop the harvest advisory tool 200 for analyzing many types of information in harvest operations. The harvest condition output profile 182 provides estimates, for example, of standing crop dry-down rates, anticipated harvest dates and suitability, fuel consumption optimizers for forced-air drying, indicators of plant 'toughness' for anticipating harvest windows, and possible loss of field workability due to the formation of frost in the soils prior to post-harvest tillage.

Figure 2:
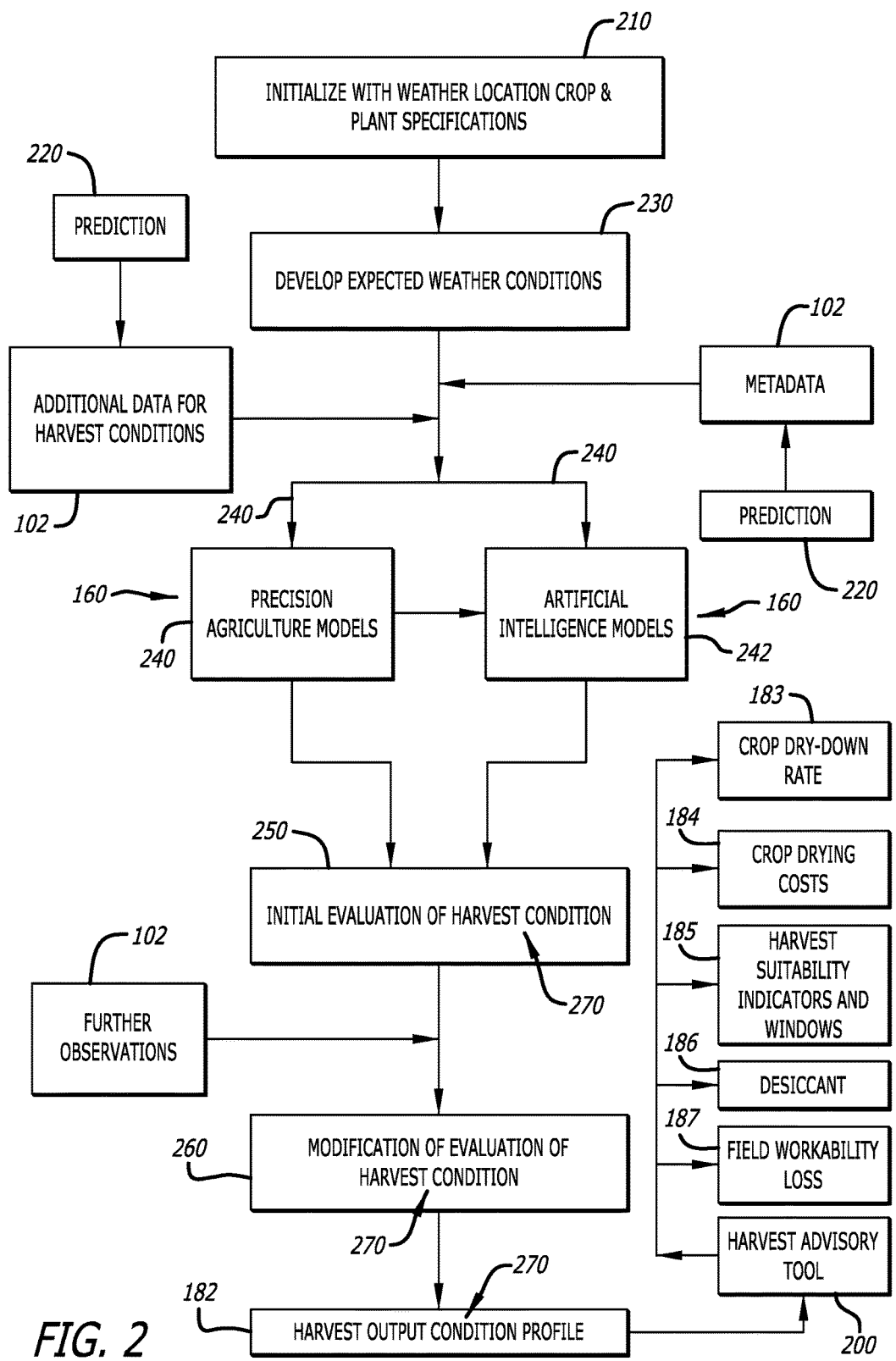
FIG. 2 is a block diagram of information flow and steps performed within a harvest advisory model and support tool according to the present invention.

FIG. 2 is a block diagram of information flow and steps performed within the harvest advisory model 100 and harvest advisory tool 200 for supporting users 300. In the present invention, the model 100 is initialized 210 by receiving various input data 102, such as weather and location specifications 110. Crop and plant specifications 120 may also be applied at this phase. The harvest advisory model 100 uses this information to develop predictions of expected weather conditions 230 using one or more weather modeling paradigms. Additional input data 102 related to specific harvest conditions 270 to be modeled may then be applied, such as seed, soil, field and facility data, and any type of metadata. The present invention may utilize one or more predictive data models 175 for generating predictions or forecasts 220 relating to such additional input data 102, depending on the type of harvest condition 270.

The expected weather conditions 230, and additional input data 102, are then applied in step 240 to one or more precision agriculture models 160. Output from such models 160 may also be further applied to develop 242 artificial intelligence models for further analysis of the harvest condition 270, as discussed further herein. The present invention performs an initial evaluation 250 of the harvest condition 270, and may ingest input data 102 representing further observations to perform modifications 260 of the initial evaluation. The present invention then produces the harvest condition output profile 182 and provides this to the harvest advisory tool 200, for use by one or more users 300 or for further distribution or processing in an API module 176.

As noted above, the harvest advisory model 100 includes a layer of artificial intelligence that may be applied to develop relationships between input data 102 and outputs from others of the precision agriculture models to perform the simulations, forecasts, diagnoses, and predictions represented in the harvest condition output profile 182. The present invention contemplates that these relationships may be developed in a variety of different ways. For example, the artificial intelligence module 173 is configured to adjust to input data 102 that includes observations provided from fields that are local or even distributed across a region. Other data applied to the artificial intelligence module 173 includes, as noted above, output from other precision agriculture models, and it is further contemplated that the original datasets for such models may be collected from institutions around the world and analyzed within the present invention. Regardless, observations may be either quantitative (e.g. grain moisture level as tested) or qualitative (e.g. the plant material became harvestable or unharvestable at a given time and location, whether or not because of environmental factors). Such information can be analyzed with respect to both recent and current weather and soil conditions, and the corresponding agronomic model outputs, to make appropriate adjustments to the unaltered agronomic model output that would otherwise be provided to the user. This information can also be used to provide updated guidance to other users in similar circumstances (with respect to locale, crop, etc.).

The artificial intelligence module 173 uses associated weather conditions, agronomic and other agricultural model outputs, environmental considerations, crop characteristics, and other relevant data, together with empirical observations where applicable, to build a more comprehensive dataset that can be used to make far-reaching improvements to (or even replacements for) the associated physical models for diagnosing and predicting the underlying harvest-related condition. For instance, the artificial intelligence layer can be applied to an adequately-sized dataset to draw automatic associations between the available external data and the harvest-related condition, effectively yielding a 'black box' model for simulating the condition. As more and more data are accumulated, the data can be sub-sampled, the artificial intelligence layer retrained, and the results tested against independent data in an effort to find the most reliable model. Further, such a model implicitly yields information as to the importance of related factors through the resulting weighting systems between inputs, subcomponents within the artificial intelligence layer, and the model output(s). This information may be used to identify which factors are particularly important or unimportant in the associated process, and thus help to target ways of improving the model over time.

The present invention contemplates that many different types of artificial intelligence may be employed within the scope thereof, and therefore, the artificial intelligence module 173 may include one or more of such types of artificial intelligence. The artificial intelligence module 173 may apply techniques including, but not limited to, k-nearest neighbor (KNN), logistic regression, support vector machines or networks (SVM), and one or more neural networks.

The use of artificial intelligence in the harvest advisory model 100 of the present invention enhances the utility of physical and empirical models by automatically and heuristically constructing appropriate relationships, mathematical or otherwise, relative to the complex interactions between growing and maturing plants, the environment in which they reside, the underlying processes and characteristics, and the observational input data made available to the system. For example, where predictive factors known to be related to a particular outcome are known and measured along with the actual outcomes in real-world situations, artificial intelligence techniques are used to 'train' or construct a model that relates the more readily-available predictors to the ultimate outcomes, without any specific a priori knowledge as to the form of those relationships.

The present invention adopts a combined approach for simulating the relationships between predictive data and eventual outcomes. In the harvest advisory model 100, the general nature of the relationships can be quantified with one or more physical models and/or with artificial intelligence models, which are then applied to a combination of the predictive data, historical data, metadata, and other physical model outputs to better simulate the ultimate outcomes. This approach permits the better-understood portions of the problem at hand to be modeled using a physical or empirical model, while permitting the less well understood portions of the problem to be automatically modeled based on the relationships implicit in the data provided to the system. In additional embodiments, with sufficient input data and output reliability and accuracy, the physical models may be entirely supplanted by the use of artificial intelligence model(s). Alternatively, the artificial intelligence layer need not be employed in the system to produce the desired output information.

The proliferation of devices for communicating data both collected and required during harvests provides the opportunity to address many issues with obtaining reliable, centralized datasets for modeling harvest activities. For example, issues arise because, although key predictive factors or ground truths are routinely measured in production agriculture, they are rarely reported into a centralized repository of data that could be used to develop models that simulate the relevant relationships. Further, the mere act of reporting and collecting this data does not in itself provide the ability to develop models based on the data. In one embodiment of the present invention, past, present, and predicted weather data for any location globally are constructed through combined application of one or more of in-situ weather observations, remotely-sensed weather observations, and meteorological analysis and prediction models. These data are made available via an API-based system for obtaining weather data for any given location and timeframe. Likewise, global, national, and regional databases of soil and land-cover characteristics are also made available via an API system, making these potentially predictive parameters readily available for association with any harvest-related observations that might become available. These data, along with user-provided crop metadata, can be used to diagnose and predict the growth and maturation of a crop to be harvested, with or without the aforementioned systems and methods including whether or not the processes are performed on a mobile device. Using a field data collection device, such as a smartphone or tablet, observations of conditions impacting harvest operations can be provided in near real-time. These observations may include grain moisture samples (whether from a trial harvest operation or manual sampling), crop harvestability metrics, field accessibility metrics, or any number of other characteristics of the crop or field that may impact the crop's behaviors or its harvest operations. Additionally, through combined application of locational information available from the device, and crop or field metadata relating to the aforementioned observations that might be collected through an application accessible on the device, data on additional predictive factors can be collected and associated with each observation. When combined with automatically-collected weather, soil, and other environmental data, these data can be used as the basis for automatically building artificial intelligence models that either simulate the future expected states of the harvest-impacting conditions directly, or that act to provide corrective adjustments to the outputs of one or more physical models for simulating the underlying processes.

The systems and methods of the present invention therefore provide the opportunity to substantially advance the state of the art in terms of planning and managing harvest operations with the use of combinations of physical and empirical models with artificial intelligence. It is further notable however that many types and sources of input data 100 allow for user-based and/or locality-based biases in the observations and predictive data that are available to develop the artificial intelligence modeling paradigms contemplated herein. Some of these biases may represent differences in perception (where subjective feedback is accepted), while others may be due to biases in the instrument(s) used to collect more quantitative observations, and even others may be due to variability in factors associated with the crop or farm operation that are outside of the realm of what is being collected in terms of metadata (for instance, the design of the particular harvesting equipment used can impact both harvestability and field-accessibility for a given operation). Because of this, the present invention contemplates development of both generalized artificial intelligence models, using all available data and metadata, and localized or user-specific artificial intelligence models tailored to analyze, for example: a particular location, user, crop, operation, soil type, and seed variety. These highly-localized or -personalized models may yield information that is more closely-tailored to the particular location or user than that provided from original data.

As noted above, the harvest advisory model 100 ingests many different types of weather information for application to the modeling approaches discussed above. This includes real-time, historical, and forecasted field-level data representative of assessments of localized weather conditions, and may include long-range climatological and/or meteorological forecasting, in one or more predictive weather models 174.

Such real-time, field-level data representative of assessments of localized weather conditions may be produced by many different sources of meteorological data to provide one or more of observed weather data and current field-level weather data, and predicted weather data, for example as data that is complementary to the data assimilation systems and forecasting systems noted below. Such additional sources of weather data may include data from both in-situ and remotely-sensed observation platforms. For example, numerical weather prediction models (NWP) and/or surface networks may be combined with data from weather radars and satellites to reconstruct the current weather conditions on any particular area to be analyzed. There are numerous industry NWP models available, and any such models may be used as sources of meteorological data in the present invention. Examples of NWP models at least include RUC (Rapid Update Cycle), WRF (Weather Research and Forecasting Model), GFS (Global Forecast System) (as noted above), and GEM (Global Environmental Model). Meteorological data is received in real-time, and may come from several different NWP sources, such as from the European Centre for Medium-Range Weather Forecasting (ECMWF), Meteorological Services of Canada's (MSC) Canadian Meteorological Centre (CMC), as well as the National Oceanic and Atmospheric Administration's (NOAA) Environmental Modeling Center (EMC), and many others. Additionally, internally or privately-generated "mesoscale" NWP models developed from data collected from real-time feeds to global and localized observation resources may also be utilized. Such mesoscale numerical weather prediction models may be specialized in forecasting weather with more local detail than the models operated at government centers, and therefore contain smaller-scale data collections than other NWP models used. These mesoscale models are very useful in characterizing how weather conditions may vary over small distances and over small increments of time. The present invention may be configured to ingest data from all types of NWP models, regardless of whether publicly, privately, or internally provided or developed.

Long-range climatological and/or meteorological forecasting may be generated by, in one aspect of the present invention, dynamical extended range weather forecast models generated from known methods for inter-seasonal to inter-annual climate prediction, which have evolved into a combination of deterministic and statistical modeling schemes that permit the capture of long-term low-frequency features. Such forecasting often requires global analyses for the specification of observed initial and boundary conditions, the use of sophisticated numerical weather prediction models, a statistical treatment of the model results, and a verification of the forecast results as a feedback into forecast refinement.

In one embodiment of the present invention, providing long-range climatological and/or meteorological forecasting may involve the use of two data assimilation systems and two forecasting systems. The two data assimilation systems may be used to provide historic and current atmospheric and land surface initial conditions and also global ocean temperatures. For example, the two forecast systems may incorporate the U.S. National Centers for Environmental Predictions (NCEP) Global Forecast System (GFS) for atmospheric predictions and the Geophysical Fluid Dynamics Laboratory Modular Ocean Model to provide sea-surface temperature predictions. Software and data supporting the above are publicly available from the NCEP.

The present invention contemplates that one or more predictive weather models 174 may be incorporated to develop expected weather conditions 230 as in FIG. 2. Such models may be executed at any desirable time interval, such as daily or hourly, to provide a complete global dataset for use in initializing the subsequent model run, and to be used to supply localized values for harvest projections for individual crop locations.

Another type of input data 102 contemplated within the scope of the present invention is image data, such as field-level processed remotely-sensed imagery in the form of remotely-sensed satellite imagery data 117 and remotely-captured drone imagery data 118, which may be ingested to provide additional support for an assessment of crop and soil states and yield metrics in the harvest advisory model 100. One source of image data representing this remotely-sensed imagery is satellite systems, such as fine temporal resolution low-earth orbit satellites that provide a minimum of three spectral bands. Another source is unmanned or remotely-piloted vehicles such as those commonly referred to as "drones". Other sources are also contemplated, such as for example manned aerial reconnaissance, lower temporal frequency earth resources satellite such as LANDSAT and MODIS, ground-based robots, and sensors mounted on field and farm equipment. Regardless of the source, this image information is field-navigated to provide users with the most recent high-resolution depiction of a field to be or being harvested. Image data may be delivered on a web or application-based device configured for use with the harvest advisory tool 200, and additional tools may be provided for spatially navigating the image data and overlaying a variety of weather data elements.

Regardless of the source, the field-level remotely-sensed raw or image data may be used by the harvest advisory model 100 to map the crop field and generate a time-series profile of harvest activity. It is contemplated that remotely-sensed satellite imagery data 117 and remotely-captured drone imagery data 118 may be analyzed prior to or in concert with application to the one or more modeling paradigms discussed herein. The remotely-sensed satellite imagery data 117 and remotely-captured drone imagery data 118 may be analyzed using a normalized difference vegetative index (NDVI) that provides the user with an evaluation of plant health, biomass, nutrient content and moisture or wetness content. Other approaches may also be employed for such analysis, such as: Modified Chlorophyll Absorption Ratio Index/Optimized Soil-Adjusted Vegetation Index (OSAVI), Triangular Chlorophyll Index/OSAVI, Moderate Resolution Imaging Spectrometer Terrestrial Chlorophyll Index/Improved Soil-Adjusted Vegetation Index (MSAVI), and Red-Edge Model/MSAVI.

The harvest advisory model 100 may further include additional sources of data, such as image-based data from systems such as video cameras, and data generated from one or more vehicle-based sensing systems, including those systems coupled to computing systems configured on harvesting equipment, or those systems configured to gather weather data from mobile devices present within vehicles, such as the mobile telephony devices and tablet computers as noted above. Crowd-sourced observational data may also be provided from farmers using mobile telephony devices or tablet computers using software tools such as mobile applications, and from other sources such as social media feeds. Meteorologist input may be still a further source of data. The data collected or used need not be in image format.

Visible adaptation of the output of any of the modeling paradigms employed within the harvest advisory model 100 and harvest advisory tool 200 to user-provided feedback data helps to foster a productive and ongoing feedback loop between the user 300 and the harvest advisory model 100 over time. While adding an artificial intelligence layer to the overall modeling system leads to output that is generally responsive to user feedback on the whole, it is possible that even the output of the artificial intelligence model (or artificial intelligence layer functioning together with a physical model) may differ from real-world observations. The present invention therefore contemplates, in another embodiment, an extra layer of forced-adaptation software for adjusting output to ensure responsiveness to feedback data and enforce the belief that data being provided is actually being used to automatically improve the corresponding model over time. Since even a model based on artificial intelligence cannot be reasonably forced to return an outcome that is consistent with what is observed, even after that observation has been included in the pool of data that was used to develop the model in the first place, a forced-adaptation layer that varies according to the nature of the problem and model(s) to which it resides is applied so that information provided to the user going forward is well-matched to the information the user has provided. For example, it is entirely possible that feedback and observational data provided by two different users, for seemingly identical situations from the perspective of the data the system has available, will conflict, even to the extent of potentially being diametrically opposed. Applied to the same adaptive learning model, the present invention may produce an indeterminate outcome because of the conflicting feedback, or even a conflicting outcome to what the user has reported. The forced adaptation layer is therefore an additional module atop the artificial intelligence layer that provides an appropriate albeit brute-force adjustment to system output to ensure that it is consistent with the feedback and observational data the user has provided for the appropriate timeframe (if one exists), so as to provide the perception of responsiveness to the user and encourage the provision of further feedback and observational data.

The present invention contemplates that many applications of the harvest advisory model 100 are used to provide specific output information for supporting farming and harvesting operations. In one such application, the harvest condition output profile 182 provides a pre-harvest prediction of in-field dry-down of a mature small grain, coarse grain, or oilseed crop over time, but crop type need not be limited to this. For example, root-based crops may be considered for either in-field crop dry-down or crop moisture acquisition. This prediction is provided via the harvest advisory tool 200 and is used for planning the timing of pre-harvest, harvest, and post-harvest operations for such crops.

The harvest advisory tool 200 provides this prediction in one or more approaches. In one such approach, the harvest advisory model 100 leverages weather prediction models to predict weather conditions that impact the rate of drying or wetting of a root-based crop or the grain associated with a mature small grain, coarse grain, or oilseed crop in a particular field. A physical model is also applied to simulate the expected dry-down of the grain in the particular field, based on the combination of crop and field characteristics and the expected weather conditions. This is accomplished by receiving one or more samples of actual grain moisture from the field at one or more times, and modifying, based on the differences between simulated and sampled moisture content at the corresponding times, the prediction of the expected dry-down of the grain in the particular field over time.

In another approach, a prediction of weather conditions that impact the rate of drying or wetting of a root-based crop or the grain associated with a mature small grain, coarse grain, or oilseed crop in a particular field is formed using crop metadata, and one or more samples of actual grain moisture from one or more fields at one or more times. The weather conditions, crop metadata, and root or grain moisture samples from one or more fields and one or more crops are applied to automatically develop an in-field root or grain dry-down model based on artificial intelligence. The harvest advisory model 100 then applies the artificial intelligence-based model to diagnose or predict the in-field dry-down of grain with similar characteristics in any field at any chosen time.

In another application, the harvest condition output profile 182 provides a prediction of the time-varying unit costs (per percent moisture per unit of mass or volume) associated with fuel-based or forced-air mechanical drying of grain resulting from changing weather conditions and the characteristics of a grain drying facility. This prediction is provided via the harvest advisory tool 200 for evaluating the impact of time-varying weather conditions on the unit costs of forced-air or fuel-based drying.

In this application, the harvest advisory model 100 leverages weather prediction models to predict weather conditions that impact the energy requirements associated with at least one of forced-air and fuel-based mechanical grain drying. This is accomplished by receiving metadata (whether past, present, or future) regarding the characteristics of at least one of forced-air and fuel-based mechanical grain drying facility and their associated resources, and applying the predicted weather data and facility metadata in at least one of an empirical, physical, and artificial intelligence model to predict the time-varying cost of at least one of forced-air and fuel-based grain drying. Factors that may impact the cost of forced-air or fuel-based drying include the atmospheric temperature and moisture content, the temperature of the grain itself (often reflective of the ambient temperature at the time of harvest), the moisture of the grain, the amount of airflow with respect to a measurement of area or volume, cost of the energy used to drive the airflow, and the energy efficiency of the facility itself. In the process of drying heat is necessary to evaporate moisture from the grain and a flow of air is needed to carry away the evaporated moisture. There are two basic mechanisms involved in the drying process; the migration of moisture from the interior of an individual grain to the surface, and the evaporation of moisture from the surface to the surrounding air. The rate of drying is determined by the moisture content and the temperature of the grain and the temperature, the (relative) humidity and the velocity of the air in contact with the grain. Likewise, facility design, such as continuous-flow dryers, batch dryers, tower dryers, and the like can impact the ultimate drying costs by 50% or more.

In yet another application, the harvest condition output profile 182 provides a prediction of the time-varying unit costs (per unit of mass or volume) associated with the combined impacts of time-varying grain moisture levels of the crop to be harvested, and the time-varying unit costs (per percent moisture per unit of mass or volume) of forced-air or fuel-based mechanical drying. This prediction is provided via harvest advisory tool 200 for evaluating the costs associated with in-field vs. facility-based drying of an agricultural commodity requiring sufficiently low moisture levels for stable long-term storage.

In this application, the harvest advisory model 100 predicts the in-field dry-down of the grain associated with a crop in a particular field using one or more physically-based and/or or artificial intelligence models to simulate the combined impacts of weather conditions, crop characteristics, and field characteristics on grain moisture levels. The harvest advisory model 100 then uses predicted weather data to predict metadata associated with one or more of forced-air and fuel-based mechanical grain drying facilities, and analyzes relationships that quantify the process of grain drying, the per-unit, time-varying cost of drying the grain (cost, per percentage point of moisture, per unit of grain mass or volume). Then, using the predicted in-field grain dry-down and the predicted cost of one or more of forced-air and fuel-based grain drying, the effective time-varying overall cost of forced-air and/or fuel-based grain drying (cost per unit of grain mass or volume) is predicted.

Another application of the present invention includes aiding in the assessment of the expected costs of forced-air or fuel-based mechanical drying of a crop owing to early harvest, relative to the potential costs of crop losses due to adverse weather conditions and the susceptibility of the in-field crop to weather and other causes of yield loss. In this application, the harvest condition output profile 182 provides an assessment of the trade-offs associated with delaying harvest operations to achieve a more appealing crop moisture level verses the risks associated with leaving the crop exposed in a field. The present invention performs this assessment by applying predictions of the in-field grain dry-down and the time-varying cost of at least one of forced-air and fuel-based grain drying to predict the effective overall time-varying cost of mechanical forced-air or fuel-based grain drying (cost, per unit of grain mass or volume). It then predicts, using crop characteristics and predicted weather data, the time-varying potential for crop yield losses owing to adverse weather conditions, and provides time-varying comparative data on the costs of at least one of forced-air and fuel-based drying associated with earlier harvest of the crop, versus the risks associated with yield losses associated with adverse weather conditions that may be experienced prior to harvest of the crop.

The present invention may also be configured to diagnose and predict the soil temperature and moisture profiles in a given field to provide guidance as to when soils in that field are likely to become exceedingly wet or frozen, thereby inhibiting harvest and post-harvest tillage operations. In this application, the harvest condition output profile 182 provides an assessment of the trade-offs associated with delaying harvest operations to achieve a more appealing crop moisture level verses the risks associated with leaving the crop exposed in a field. The present invention performs this assessment by applying predictions of the in-field grain dry-down and the time-varying cost of at least one of forced-air and fuel-based grain drying to predict the effective overall time-varying cost of mechanical forced-air or fuel-based grain drying (cost, per unit of grain mass or volume). In parallel it also predicts, using crop characteristics, soil data, and predicted weather data, the time-varying likelihood of at least one of excess moisture or frost developing within the soil profile, and provides time-varying comparative data on the costs of forced-air or fuel-based drying associated with earlier harvest of the crop, versus the risks associated with excessive moisture or frost developing within the soil profile prior to the time when at least one of harvest operations and post-harvest tillage operations can be completed.

In another application, the harvest condition output profile 182 enables a diagnosis and prediction of the impacts of time-varying soil temperature profile in a given field as it pertains to the internal temperature of root-based crops and their long-term storage stability at those temperatures. This is provided via harvest advisory tool 200 for aiding in the timing of harvest operations so as to optimize storage conditions.

The present invention provides this diagnosis and prediction in one or more approaches. In one approach, the harvest advisory model 100 leverages at least one of weather prediction models, land surface, and soil models to predict the time varying temperature and moisture content of a root-based crop intended to be harvested. Utilizing predicted weather conditions, the present invention then predicts, using the crop temperature and moisture, and airflow characteristics of the storage pile or facility, the stability of the crop for long-term storage.

In another approach, the present invention collects data on crop temperature and moisture, storage dimensions, and airflow characteristics for a stored crop, over time. It then compares this crop storage data against at least one of time-varying weather data and outputs of models for simulating crop moisture and temperature characteristics in the corresponding times and locations, for the corresponding crops, to develop artificial intelligence models for relating these crop storage characteristics to the more readily-available weather data and outputs of models for simulating crop moisture and temperature characteristics. Using the airflow characteristics of the storage pile or facility, and the artificial intelligence model and at least one of forecast weather data and forecast outputs of models for simulating crop temperature and moisture characteristics, the present invention then provides a forecast of the likely windows of harvestability on the current and future days and the potential for crop stability for long-term storage.

In another application, the harvest condition output profile 182 enables prediction of the day-by-day windows of opportunity for harvest operations owing to time-varying threshability as a result of interactions between a standing or windrowed crop and atmospheric and soil conditions. The present invention provides this prediction to aid in more immediate planning of harvest operations in one or more approaches. In one approach, the harvest advisory model 100 predicts the daily window of harvest opportunity due to the impact of plant wetness on crop threshability by collecting data on temporal windows of harvestability for a particular crop at a particular location over some recent period of time, and comparing this harvestability data against at least one of time-varying weather data and outputs of models for simulating plant wetness characteristics in the crop in order to identify relationships between these external data and the reported harvestability data. The harvest advisory model 100 then provides, based on these identified relationships and the at least one of time-varying weather forecast data and forecast outputs of models for simulating plant wetness characteristics, a forecast of the likely windows of harvestability on the current and future days.

In another approach, the present invention predicts the daily window of harvest opportunity due to the impact of plant wetness on crop threshability by collecting data on windows of harvestability for various crops at various locations, over time, and comparing this harvestability data against at least one of time-varying weather data and outputs of models for simulating plant wetness characteristics in the corresponding times and locations, for the corresponding crops, in order to develop artificial intelligence models for relating these windows of harvestability to the more readily-available weather data and outputs of models for simulating plant wetness characteristics. The harvest advisory model 100 then provides, using the artificial intelligence model and at least one of forecast weather data and forecast outputs of models for simulating plant wetness characteristics, a forecast of the likely windows of harvestability on the current and future days.

The present invention may also be configured for an application in which the harvest condition output profile 182 enables prediction of the dry-down of cutting crops such as hay (and others, for example alfalfa) over time. The harvest advisory tool 200 uses this output of the harvest advisory model 100 for planning the timing of, or predicting windows of opportunity for, cutting, windrowing, silageing, or bailing operations for hay fields.

The present invention performs this collecting of data on temporal windows of cut-windrow-bail during consecutive and disjoint operations for hay at a particular location over some recent period of time, and compares this operational data against at least one of time-varying weather data and outputs of models for simulating plant wetness characteristics in the hay in order to identify relationships between these external data and the reported operational data. The harvest advisory model 100 then provides, based on these identified relationships and the at least one of time-varying weather forecast data and forecast outputs of models for simulating plant wetness characteristics, a forecast of the likely windows of, for example, cut-windrow-bail operations on the current and future days.

Additionally, the present invention may also be configured for an application in which the harvest condition output profile 182 provides assistance with the decision to apply a desiccant to affect a desired harvest window. The harvest advisory tool 200 uses this output of the harvest advisory model 100 in one or more approaches. In one such approach, the present invention collects data on temporal windows of mature growth stages, and desiccant efficacy and harvestability for a particular desiccant for particular crop at a particular location over some recent period of time. It then compares crop growth stage, desiccant, and harvestability data against at least one of time-varying weather data and outputs of models for simulating plant wetness and seed moisture characteristics in the crop in order to identify relationships between these external data and the reported crop growth stage, desiccant, and harvestability data. The present invention then provides, based on these identified relationships and the at least one of time-varying weather forecast data and forecast outputs of models for simulating plant wetness and seed moisture characteristics, a forecast of the likely windows of desiccant efficacy, and subsequently the crop moisture, on the current and future days.

In another approach, the harvest advisory model 100 collects data on temporal windows of mature growth stages, desiccant efficacy, and harvestability for a particular desiccant for a particular crop at a particular location over some recent period of time, and compares crop growth stage, desiccant, and harvestability data against at least one of time-varying weather data and outputs of models for simulating plant wetness and seed moisture characteristics in the crop in order to develop artificial intelligence models relating these external data and the reported crop growth stage, desiccant, and harvestability data. The harvest advisory tool 200 then provides, using the artificial intelligence model and at least one of time-varying weather forecast data and forecast outputs of models for simulating plant wetness and seed moisture characteristics, a forecast of the likely windows of desiccant efficacy, and subsequently the crop moisture, on the current and future days.

The execution of the harvest advisory model 100 prior to, during, or following harvest activities, addresses multiple factors that can be used by farmers to improve and enhance management of harvest operations. The harvest advisory tool 200 provides farmers with many different types of harvest-related information, such as evaluations, predictions, forecast, and diagnoses of harvest conditions 270. As noted above, this harvest-related information may include estimates of standing crop dry-down rates, anticipated harvest dates and suitability, fuel consumption optimizers for forced-air drying, indicators of plant 'toughness' for anticipating harvest windows, and possible loss of field workability due to the formation of frost in the soils prior to post-harvest tillage.

One specific example of such harvest-related information include predictions of expected in-field, pre-harvest dry-down 183 of a mature small grain, coarse grain or oilseed crop over time, so that users 300 can plan the timing of a harvest operation. Another example is a prediction of time-varying unit costs associated with at least one of fuel-based or forced-air mechanical drying 184 of grain resulting from changing weather conditions and characteristics of the grain drying facility, for post-harvest crop storage. Yet another example is an assessment of expected costs of forced-air or fuel-based mechanical drying of a crop owing to early harvest relative to the potential costs of crop losses due to adverse weather conditions and the susceptibility of the in-field crop to weather and other causes of yield loss. Still another example is a diagnosis and prediction of soil temperature and moisture profiles in a given field, to provide guidance as to when soils in that field are likely to become exceedingly wet or frozen, thereby inhibiting harvest and post-harvest tillage operations. A further example is a diagnosis and prediction of the impacts of a time-varying soil temperature profile in a given field as it pertains to the internal temperature of root-based crops and their long-term storage stability at those temperatures, thereby aiding in the timing of harvest operations so as to optimize storage conditions. Still a further example is prediction of harvest opportunity windows 184, such as the daily window of harvest opportunity due to the impact of plant wetness on crop threshability, and the timing or windows of opportunity of cutting, windrowing, silageing, or bailing operations with regard to dry-down of hay (alfalfa et al.) cutting over time. Additional examples involve a determination of whether to apply a desiccant 186 to affect a desired harvest window, and a determination of field workability loss 187.

The harvest advisory tool 200 contemplates that output data 180 may be generated for visual representation of the information contained, for example on a graphical user interface. With the harvest advisory tool 200, users may be able to configure settings for, and view various aspects of, the harvest advisory model 100 using a display on such graphical user interfaces, and/or via web-based or application-based modules. Tools and pull-down menus on such a display (or in web-based or application-based modules) may also be provided to customize the type and nature of the input data 102 applied to the various modeling paradigms of the harvest advisory model 100, as well as the output data 180 provided in the harvest condition output profile 182. Examples of this include the tactile and/or haptic notifications of changes in the harvest conditions discussed herein. Other types of notifications may include those provided via applications resident on mobile telephony, tablet, or wearable devices are also possible, such as for example a voice-based output generated to verbally notify farmers of possible disease or pest risk.

As noted above, the output data 180 of the harvest advisory model 100 may be used to generate a plurality of advisory services 190 in one or more application programming interface (API) modules 176. These advisory services 190 provide enhanced decision-making support to harvest operations in precision agricultural production.

These advisory services 190 are driven by the generation of the harvest condition output profile 182 that results in the harvest action reporting and harvest summary reporting aspects of the output data 180. Each of these advisory services 190 enriches the utilization and application of the augmented crop growth model 100.

One such advisory service 190 is a current and historical weather reporting service 192. Site-specific weather information is an important element of field recordkeeping in agricultural production. Using the field geo-positional information provided for the harvest advisory modeling, current and historical weather for the field location may be provided as an advisory service for specific geographical locations.

A soil modeling service 194 is another advisory service 190 contemplated within the scope of the present invention. One API module 176 applies the harvest condition output profile 182 and output data 180 to a sophisticated soil model to generate information that provides a better understanding of current and future soil conditions relative to historical soil conditions at harvest times. Such a soil model supports the use of existing soil properties e.g., organic matter, soil type, etc., tillage practices, presence of tile drainage, and irrigation history, along with the advanced short-, medium-, or long-range weather forecasting. This coupling of modeled soil characteristics with advanced weather forecasting information at harvest times provides a valuable tool for indicating crop potential. The output of an API module 176 generating this soil modeling service 194 may be further configured to provide a detailed past-through-future analysis of soil characteristics impacting harvest conditions, such as soil temperature and moisture assessments, including freeze and thaw information, the amount of water 'throughput', runoff or ponding of soils, and an important interpretation of workability of the soils.

Another advisory service 190 is soil conditions forecasting service 196. The soil modeling service 194 can be used with prediction of expected weather conditions to provide an estimate of future soil conditions at harvest times in this advisory service 190. Using the weather and location specifications 110, a forecast of soil temperature and moisture conditions for the specified field location can generated. Such a forecast in this service 196 enables anticipation of periods of suitable soil conditions for field operations, including workability, particularly those after periods of rainfall.

Another advisory service 190 as an output 180 of the harvest advisory model 100 is a harvest alerts service 198. The importance of information provided to production agriculture in the present invention dictates a necessity for an effective and direct method of conveying information. The harvest alerts service 198 may utilize a 'push' technology for immediate and direct dissemination of information provided as output data 180 from the harvest advisory model 100. The API module 176 that generates this service may be configured to so that as the time for conducting a harvest operation nears, users may receive alerts of important combinations of weather conditions, risk factors, and decision-support aides for the purposes of managing and timing harvest operations. This is supported by user-specified elements including alert parameters, location(s), lead time(s), time(s) of day, and the particular device(s) to receive the alerts. For example, a custom harvesting operation may integrate their work orders with such an alerting system in order to optimize the logistics of their operation by avoiding costly weather-related delays to harvest operations, through either spatial or temporal reassignment of equipment and related resources.

As noted above, the present invention may in one embodiment is configured to diagnosis and prediction of the impacts of a time-varying soil temperature profile in a given field as it pertains to the internal temperature of root-based crops and their long-term storage stability at those temperatures. Such a model aids in the timing of harvest operations so as to optimize crop storage conditions.

Such an embodiment is performed in a system and method of evaluating a timing of harvest operations and crop storage conditions, comprising in which a profile of long-term storability of an agricultural commodity is developed with a harvest advisory model. The harvest advisory model in this embodiment predicts expected weather conditions relative to a timing of harvest operations and crop storage conditions by applying weather information including recent and current field-level weather data and extended-range weather forecast data, and field-specific information including location data representing a field where an agricultural commodity is planted to one or more predictive numerical weather models. The harvest advisory model forecasts harvestability windows over a specified period of time and crop stability for long-term storage, by simulating the expected weather conditions, crop-specific information for an agricultural commodity to be harvested, and the field-specific information in an agricultural model of one or more physical and empirical characteristics of crop moisture and crop temperature for harvestability of crops at corresponding times and locations. The agricultural model comprises at least one of a crop-specific growing degree day model, a soil model, a land surface model. Also, an artificial intelligence model may be developed to simulate crop storage characteristics from the expected weather conditions, one or more sampled observations from a planted field, and crop storage facility data by building a comprehensive dataset for the agricultural model of one or more physical and empirical characteristics of crop moisture and crop temperature for harvestability of crops at corresponding times and locations.

The systems and methods of the present invention may be implemented in many different computing environments 150. For example, they may be implemented in conjunction with a special purpose computer, a programmed microprocessor or microcontroller and peripheral integrated circuit element(s), an ASIC or other integrated circuit, a digital signal processor, electronic or logic circuitry such as discrete element circuit, a programmable logic device or gate array such as a PLD, PLA, FPGA, PAL, and any comparable means. In general, any means of implementing the methodology illustrated herein can be used to implement the various aspects of the present invention. Exemplary hardware that can be used for the present invention includes computers, handheld devices, telephones (e.g., cellular, Internet enabled, digital, analog, hybrids, and others), and other such hardware. Some of these devices include processors (e.g., a single or multiple microprocessors), memory, nonvolatile storage, input devices, and output devices. Furthermore, alternative software implementations including, but not limited to, distributed processing, parallel processing, or virtual machine processing can also be configured to perform the methods described herein.

The systems and methods of the present invention may also be partially implemented in software that can be stored on a storage medium, executed on programmed general-purpose computer with the cooperation of a controller and memory, a special purpose computer, a microprocessor, or the like. In these instances, the systems and methods of this invention can be implemented as a program embedded on a mobile device or personal computer through such mediums as an applet, JAVA® or CGI script, as a resource residing on one or more servers or computer workstations, as a routine embedded in a dedicated measurement system, system component, or the like. The system can also be implemented by physically incorporating the system and/or method into a software and/or hardware system.

Additionally, the data processing functions disclosed herein may be performed by one or more program instructions stored in or executed by such memory, and further may be performed by one or more modules configured to carry out those program instructions. Modules are intended to refer to any known or later developed hardware, software, firmware, artificial intelligence, fuzzy logic, expert system or combination of hardware and software that is capable of performing the data processing functionality described herein.

The foregoing descriptions of embodiments of the present invention have been presented for the purposes of illustration and description. It is not intended to be exhaustive or to limit the invention to the precise forms disclosed. Accordingly, many alterations, modifications and variations are possible in light of the above teachings, may be made by those having ordinary skill in the art without departing from the spirit and scope of the invention. It is therefore intended that the scope of the invention be limited not by this detailed description. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a sub-combination or variation of a sub-combination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the essential idea of the invention.

The invention claimed is:

1. A method comprising:
   ingesting, as input data, weather information and crop-specific information for a grain crop to be harvested, the weather information including recent and current field-level weather data and extended-range weather forecast data, and the crop-specific information at least including a sampled moisture content of the grain crop collected by sensors associated with agricultural equipment in a particular field hosting the grain crop to be harvested, the sensors configured to gather data related to in-field dry down directly from the particular field, the sampled moisture content representing an amount of water present in the grain crop reaped as a percentage of weight;
   modeling the input data in a plurality of data processing modules within a computing environment in which the plurality of data processing modules are executed in conjunction with at least one processor, the data processing modules configured to project an in-field dry-down of the grain crop over time for a planning of harvest operations by
   1) predicting expected weather conditions impacting a rate of drying of the grain crop in the particular field,
   2) developing an agricultural model that applies the expected weather conditions and one or more physical and empirical characteristics of a grain crop from the crop-specific information to perform one or more simulations to forecast changes in an in-field moisture content of the grain crop over time in the particular field, and
   3) continually augmenting the forecasted changes in the in-field moisture content over time by performing additional simulations based on the sampled moisture content of the grain crop collected by the sensors associated with the agricultural equipment in the particular field as a growing season progresses, updated field-level weather observations, and updated weather forecast data for a geographical area including the particular field, to predict expected times for the grain crop to reach one or more in-field moisture content thresholds;
   generating, as output data, a harvest condition profile representing one or more predictions of the in-field dry-down of the grain crop in the particular field based on the forecasted changes in the in-field moisture content over time; and
   developing a harvest schedule for performing one or more agricultural activities from the harvest condition profile in the particular field, wherein a user performs the one or more agricultural activities based on the harvest schedule, or an automated performance of the one or more agricultural activities by an agricultural vehicle is controlled based on the harvest schedule.

2. The method of claim 1, further comprising generating one or more advisories for at least one of a harvesting machine in the particular field, a user onboard the harvesting machine, and a user involved in harvest operations in the particular field, based on the harvest condition profile.

3. The method of claim 2, further comprising applying the harvest condition profile to a harvest advisory tool configured to provide the one or more advisories to the at least one of a harvesting machine in the particular field, a user onboard the harvesting machine, and a user involved in harvest operations in the particular field.

4. The method of claim 2, wherein the one or more advisories include an advisory that the grain crop will experience further in-field drying over a specified time period, an advisory that the grain crop will not experience further in-field drying over a specified time period, and an advisory that the grain crop will reach a desired moisture content in an anticipated harvest window.

5. The method of claim 1, wherein the crop-specific information further includes one or more of anticipated temporal harvest windows, crop growth stage data, crop relative maturity data, crop planting depth and row spacing data, crop planting date data, crop post-maturity dry-down characteristics, and targeted harvest crop moisture or temperature thresholds for the grain crop.

6. The method of claim 1, wherein the modeling further comprises applying the weather information to one or more predictive numerical weather models to generate the prediction of expected weather conditions.

7. The method of claim 1, wherein the applying the expected weather conditions and the crop-specific information to an agricultural model that applies one or more physical and empirical characteristics of the grain crop further comprises simulating the rate of drying of the grain crop in a particular field, identifying differences in one or more simulations of the rate of drying with the sampled moisture content at corresponding times, and modifying the one or more simulations based on the differences between the otherwise simulated rate of drying and the sampled moisture content at the corresponding times.

8. The method of claim 1, further comprising applying the expected weather conditions, the sampled moisture content, and crop metadata representing actual and/or realized performance of the grain crop over a specified time period to automatically develop an artificial intelligence model configured to analyze a specific in-field dry-down of grain crop by building a comprehensive harvest condition dataset for the agricultural model that applies one or more physical and empirical characteristics of a grain crop to forecast changes in an in-field moisture content of a grain crop with similar characteristics in any field at any selected time.

9. The method of claim 1, wherein the grain crop is at least one of a mature small grain, coarse grain, or oilseed crop.

10. A method of evaluating moisture content of a grain crop to support harvest operations, comprising:
within a computing environment comprised of a computer processor and at least one computer-readable storage medium operably coupled to the computer processor and having program instructions stored therein, the computer processor being operable to execute the program instructions to project an in-field dry-down of the grain crop over time for a planning of harvest operations in a harvest advisory model configured to perform the steps of:
predicting expected weather conditions impacting a rate of drying of the grain crop in a particular field hosting the grain crop at one or more temporal harvest windows by applying weather information comprised of recent and current field-level weather data and extended-range weather forecast data to one or more predictive numerical weather models;
developing an agricultural model that applies the expected weather conditions and one or more physical and empirical characteristics of a grain crop from crop-specific information that at least includes a sampled moisture content of the grain crop collected by sensors associated with agricultural equipment in the particular field, the sensors configured to gather data related to an in-field dry-down directly from the particular field, to model the rate of drying of the grain crop over time in the particular field by performing one or more simulations, the sampled moisture content representing an amount of water present in the grain crop reaped as a percentage of weight;
forecasting changes in an in-field moisture content of the grain crop over time in the particular field as the one or more temporal harvest windows approach from the rate of drying; and
continually augmenting the forecasted changes in the in-field moisture content over time by performing additional simulations based on the sampled moisture content of the grain crop collected by the sensors associated with the agricultural equipment in the particular field as a growing season progresses, updated field-level weather observations, and updated weather forecast data for a geographical area including the particular field, to predict expected times for the grain crop to reach one or more in-field moisture content thresholds; and
developing a harvest schedule for performing one or more agricultural activities from the harvest condition profile in the particular field, wherein a user performs the one or more agricultural activities based on the harvest schedule, or an automated performance of the one or more agricultural activities by an agricultural vehicle is controlled based on the harvest schedule.

11. The method of claim 10, further comprising generating a harvest condition profile representing one or more predictions of the in-field dry-down of the grain crop in the particular field based on the forecasted changes in the in-field moisture content over time.

12. The method of claim 11, further comprising generating one or more advisories for at least one of a harvesting machine in the particular field, a user onboard the harvesting machine, and a user involved in harvest operations in the particular field, based on the harvest condition profile.

13. The method of claim 12, wherein the one or more advisories include an advisory that the grain crop will experience further in-field drying over a specified time period, an advisory that the grain crop will not experience further in-field drying over a specified time period, and an advisory that the grain crop will reach a desired moisture content in an anticipated harvest window.

14. The method of claim 12, further comprising applying the harvest condition profile to a diagnostic support tool configured to provide the one or more advisories to the at least one of a harvesting machine in the particular field, a user onboard the harvesting machine, and a user involved in harvest operations in the particular field, based on the harvest condition profile.

15. The method of claim 10, further comprising simulating the rate of drying in the agricultural model that applies one or more physical and empirical characteristics of a grain crop, and modifying one or more simulations of the rate of drying using differences between the otherwise simulated rate of drying and the sampled moisture content of the grain crop collected by agricultural equipment in the particular field at corresponding times.

16. The method of claim 10, wherein the crop-specific information further includes one or more of crop relative maturity data, crop planting depth and row spacing data, crop planting date data, crop post-maturity dry-down characteristics, and targeted harvest crop moisture or temperature thresholds.

17. The method of claim 10, further comprising automatically developing or more artificial intelligence artificial models configured to analyze a specific in-field dry-down of a grain crop by building a comprehensive harvest condition dataset for the agricultural model of one or more physical and empirical characteristics that applies one or more physical and empirical characteristics of a grain crop to forecast changes in an in-field moisture content of a grain crop with similar characteristics in any field at any selected time.

18. The method of claim 10, wherein the grain crop is at least one of a mature small grain, coarse grain, or oilseed crop.

19. A system comprising:
a computing environment including at least one computer-readable storage medium having program instructions stored therein and a computer processor operable to execute the program instructions to project an in-field dry-down of the grain crop over time for a planning of harvest operations by performing a harvest advisory model within a plurality of data processing modules, the plurality of data processing modules including:

a weather modeling module configured to predict expected weather conditions impacting a rate of drying of the grain crop in a particular field hosting the grain crop to be harvested by applying weather information including recent and current field-level weather data and extended-range weather forecast data to one or more predictive numerical weather models;

one or more modules configured to develop an agricultural model that aggregates the expected weather conditions and one or more physical and empirical characteristics of a grain crop with crop-specific information at least including a sampled moisture content of the grain crop collected by sensors associated with agricultural equipment in the particular field, the sensors configured to gather data related to an in-field dry-down directly from the particular field, and the sampled moisture content representing an amount of water present in the grain crop reaped as a percentage of weight, the agricultural model configured to perform one or more simulations to forecast changes in an in-field moisture content of the grain crop over time in the particular field, and continually augment the forecasted changes in the in-field moisture content over time by performing additional simulations based on the sampled moisture content of the grain crop collected by the sensors associated with the agricultural equipment in the particular field as a growing season progresses, updated field-level weather observations, and updated weather forecast data for a geographical area including the particular field, to predict expected times for the grain crop to reach one or more in-field moisture content thresholds;

a harvest condition module configured to generate a harvest condition profile representing one or more predictions of the in-field dry-down of the grain crop in the particular field based on the forecasted changes in the in-field moisture content of the grain crop over time, and one or more advisories to at least one of a harvesting machine in the particular field, a user onboard the harvesting machine, and a user involved in harvest operations in the particular field based on the harvest condition profile; and an output module configured to develop a harvest schedule for performing one or more agricultural activities from the harvest condition profile in the particular field, wherein a user performs the one or more agricultural activities based on the harvest schedule, or an automated performance of the one or more agricultural activities by an agricultural vehicle is controlled based on the harvest schedule.

20. The system of claim 19, wherein the harvest condition profile is applied to a diagnostic support tool configured to provide the one or more advisories to one or more of a user performing harvest operations, and agricultural equipment performing harvest operations.

21. The system of claim 19, wherein the one or more advisories include an advisory that the grain crop will experience further in-field drying over a specified time period, an advisory that the grain crop will not experience further in-field drying over a specified time period, and an advisory that the grain crop will reach a desired moisture content in an anticipated harvest window.

22. The system of claim 19, wherein the crop-specific information further includes one or more of anticipated temporal harvest windows, crop growth stage data, crop relative maturity data, crop planting depth and row spacing data, crop planting date data, crop post-maturity dry-down characteristics, and targeted harvest crop moisture or temperature thresholds for the grain crop.

23. The system of claim 19, wherein the one or more modules are further configured to simulate the rate of drying in the agricultural model that applies one or more physical and empirical characteristics of a grain crop, and modify one or more simulations of the rate of drying using differences between the otherwise simulated rate of drying and the sampled moisture content of the grain crop collected by agricultural equipment in the particular field at corresponding times.

24. The system of claim 19, wherein the one or more modules are further configured to automatically develop an artificial intelligence model configured to analyze a specific in-field dry-down of a grain crop by building a comprehensive dataset for the agricultural model that applies one or more physical and empirical characteristics of a grain crop, and predict in-field dry-down of a crop with similar characteristics in any field at any selected time.

25. The system of claim 19, wherein the grain crop is at least one of a mature small grain, coarse grain, or oilseed crop.

* * * * *